(12) United States Patent
Park

(10) Patent No.: US 12,243,814 B2
(45) Date of Patent: Mar. 4, 2025

(54) METHOD OF IMPROVING CURRENT BALANCE OF PARALLEL CHIPS IN POWER MODULE AND POWER MODULE EMPLOYING SAME

(71) Applicant: HYUNDAI MOBIS Co., Ltd., Seoul (KR)

(72) Inventor: Yu Cheol Park, Anyang-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 485 days.

(21) Appl. No.: 17/574,993

(22) Filed: Jan. 13, 2022

(65) Prior Publication Data

US 2023/0223330 A1 Jul. 13, 2023

(51) Int. Cl.
*H01L 23/00* (2006.01)
*H01L 21/48* (2006.01)
*H01L 23/498* (2006.01)
*H01L 25/07* (2006.01)

(52) U.S. Cl.
CPC ...... *H01L 23/49844* (2013.01); *H01L 21/485* (2013.01); *H01L 25/072* (2013.01); *H01L 24/48* (2013.01); *H01L 2224/48225* (2013.01)

(58) Field of Classification Search
CPC ............. H01L 23/49844; H01L 21/485; H01L 25/072; H01L 24/48; H01L 2224/48225; H01L 23/3735; H01L 23/50; H01L 23/5386; H01L 23/647; H01L 24/49; H02M 1/088; H02M 7/003
See application file for complete search history.

(56) References Cited

U.S. PATENT DOCUMENTS

| 2006/0171178 | A1 | 8/2006 | Shvarts |
| 2017/0125322 | A1 | 5/2017 | Spann et al. |
| 2022/0302075 | A1* | 9/2022 | Masuda ............... H01L 23/049 |

FOREIGN PATENT DOCUMENTS

KR 10-1232298 B1 2/2013

* cited by examiner

*Primary Examiner* — Elias Ullah
(74) *Attorney, Agent, or Firm* — NSIP Law

(57) ABSTRACT

In the present invention, in order to reduce parasitic inductances of a gate line and a source line of a power module to reduce a current deviation (current balancing) which is a problem when the power module composed of a plurality of parallel chips is driven, in a power module including a plurality of power semiconductor chips connected to gate lines and source lines extending from gate pins and source pins in parallel by different distances, a current area of each of the gate lines and the source lines connected to chips other than a first chip closest to the gate pin and the source pin is formed larger than a current area of each of the gate line and the source line connected to the first chip.

18 Claims, 8 Drawing Sheets

METHOD OF IMPROVING CURRENT BALANCE OF PARALLEL CHIPS IN POWER MODULE AND POWER MODULE EMPLOYING SAME

FIELD

The present invention relates to a power module, and more specifically, a technology which improves a current balance of parallel chips constituting a power module.

BACKGROUND

A power module refers to a module in which a power semiconductor (IGBT, MOSFET or the like) used for power conversion, an overcurrent/overheat protection circuit, and the like are mounted and embedded in a dedicated case.

FIG. 1 is a cross-sectional view of a conceptual configuration of a power module. In a description from above, a bonding wire 16 which connects a chip 12 and a circuit pattern 15 or other elements of a direct bond copper (DBC) 14, and a solder which bonds the chip 12 and the DBC 14 are present. The circuit pattern 15 through which current flows is formed in the DBC 14 using a conductor (Cu or the like) as shown in FIG. 2. The DBC 14 has a form in which Cu which is a conductor is attached to both surfaces of a ceramic substrate which is an insulator. The DBC 14 requires terminals 24 which come into contact with a heat dissipation plate 22 through thermal grease 20, and are connected to external + and − terminals.

FIG. 3 is a configuration diagram of one type of a power semiconductor. In FIG. 3, the chips 12 include five chips at an upper side and five chips at a lower side from M1 to M10, and as shown in FIG. 4, the chips 12 are configured in parallel, and a gate and a source of each chip 12 are connected to corresponding lines through the bonding wire 16. Each chip 12 is connected to a gate line through an individual resistor 13. In FIG. 3, gate pins G_H and G_L and source pins S_H and S_L of the chips 12 which are connected in parallel by five are connected to the upper side and the lower side by only one, respectively. Accordingly, in a description with respect to the upper side in FIG. 3, M5 is close to the gate pin G_H and the source pin S_H, and M1 is distant from the gate pin G_H and the source pin S_H. Accordingly, the five chips 12 are not simultaneously driven, but sequentially driven from the close chip to the distant chip during parallel driving.

FIG. 5 illustrates a target circuit for performing simulation to check a current balance of the chips which are connected in parallel. A parasitic inductance of the power module configured as shown in FIG. 3 is extracted through "Q3D" program by Ansys and added to each gate. With respect to the upper side, a parasitic inductance of a MOSFET chip M5 closest to the gate pin and the source pin is 13.4 nH, and a parasitic inductance of a chip M1 most distant from the gate pin and the source pin is 28.5 nH. Even in the case of the lower side having the same configuration, a parasitic inductance of a chip M6 closest to the gate pin and the source pin is 13.4 nH and a parasitic inductance of a chip M10 most distant from the gate pin and the source pin is 28.5 nH. The remaining parasitic inductance values are as follows: M2 is 24.6 nH, M3 is 20.8 nH, M4 is 17.1 nH, M7 is 17.1 nH, M8 is 20.8 nH, and M9 is 24.6 nH.

FIG. 6 illustrates a waveform of performing simulation of a circuit diagram in FIG. 5 through "OrCAD". An upper waveform indicates a current flowing through each chip and a lower waveform indicates a gate voltage of each chip, which are obtained from measurement points in the circuit diagram of FIG. 5.

FIG. 7 illustrates an enlarged waveform of a portion "A" indicated in FIG. 6. The indicated portion "A" is a waveform when a chip switch is turned off. In FIG. 7, square (□) marked lines are curved lines of a current and a gate voltage of the most distant chip M10, and circle (○) marked lines are curved lines of a current and a gate voltage of the closest chip M6. It can be seen that the closest chip M6 is more quickly turned off than other chips according to the gate voltage curved line at a lower side in FIG. 7, and the current curved line at an upper side is lower than those of other chips. A maximum current difference between M6 (17.6 A) and M10 (18.3 A) is approximately 0.9 A, and a current deviation of approximately 4% is present.

SUMMARY OF THE INVENTION

As described above, in a conventional power module, a plurality of chips should be connected in parallel and driven, but distances from a gate pin terminal and a source pin terminal to each chip should be physically different, and accordingly, there is a parasitic inductance difference between the chips, and thus, a current deviation occurs. As a result, a current balance of an overall power semiconductor power module deteriorates.

The present invention is directed to reducing parasitic inductances of a gate line and a source line of the power module to reduce a current deviation which is a problem when the power module composed of a plurality of parallel chips is driven.

To solve the problems, according to an aspect of the present invention, a method of improving a current balance of parallel chips in a power module includes forming a current area of each of gate lines and source lines connected to chips other than a first chip closest to a gate pin and a source pin larger than a current area of each of a gate line and a source line connected to the first chip in the power module including a plurality of power semiconductor chips (hereinafter, referred to as 'chips') connected to the gate lines and the source lines extending from the gate pins and the source pins in parallel by different distances Further, according to another aspect of the present invention, in a power module including a plurality of power semiconductor chips (hereinafter, referred to as 'chips') connected to gate lines and source lines extending from gate pins and source pins in parallel by different distances, a current area of each of the gate lines and the source lines connected to chips other than a first chip closest to the gate pin and the source pin is larger than a current area of each of the gate line and the source line connected to the first chip.

The present invention will become more apparent through embodiments described below in detail with reference to the drawings.

EFFECT

According to the present invention, since a current deviation during driving of parallel chips is reduced, current tolerance of a module increases and thus performance is improved. A current deviation of 10% and a maximum current of 45 A are allowed when five 10 A chips are used in parallel, but a current deviation of 0% and a maximum current of 50 A can be allowed when the same five 10 A chips are used in parallel.

DESCRIPTION OF THE PREFERRED EMBODIMENT

Hereinafter, preferable embodiments of the present invention will be described in detail with reference to the accompanying drawings. Advantages and features of the present invention, and a method of achieving them, will become apparent with reference to preferable embodiments which are described in detail in conjunction with the accompanying drawings. Terms used in the description are provided not to limit the present invention but to describe the embodiments. In the embodiments, the singular form also includes the plural form unless otherwise specifically mentioned. Further, the terms 'comprise' and/or 'comprising' used in the specification are used in the sense of not precluding the presence or addition of at least one other component, step, operation, and/or element other than the stated components, steps, operations and/or elements.

Figure 8:
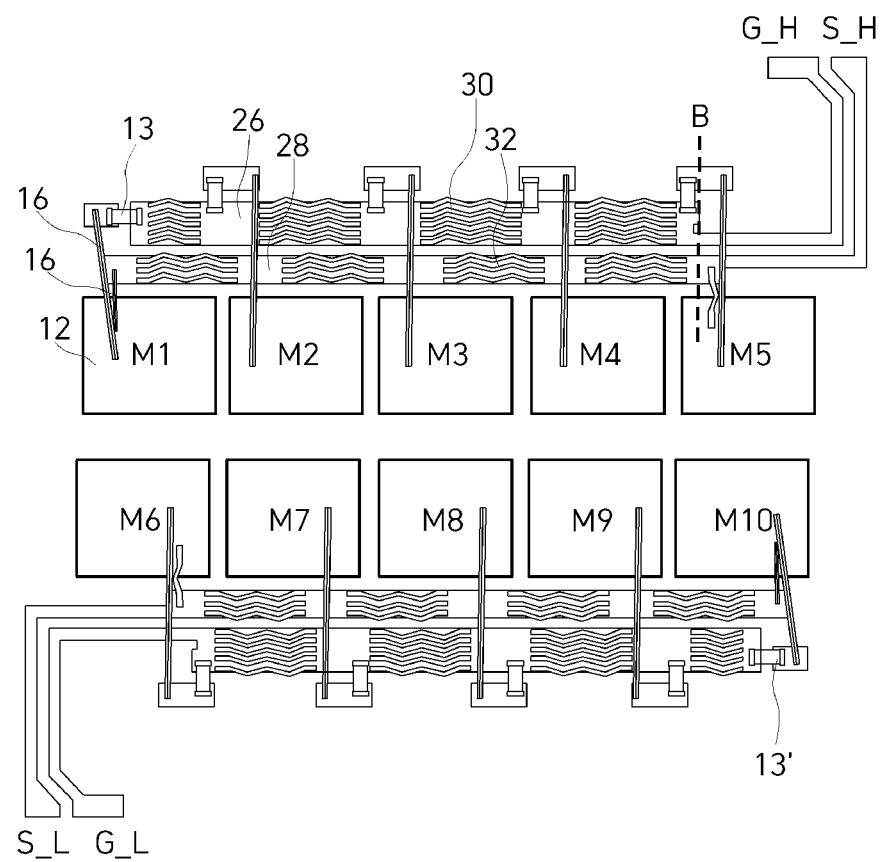
FIG. 8 is a view illustrating the inside of a power module proposed in the present invention.

FIG. 8 is a view illustrating the inside of a power module proposed in the present invention.

Figure 1:
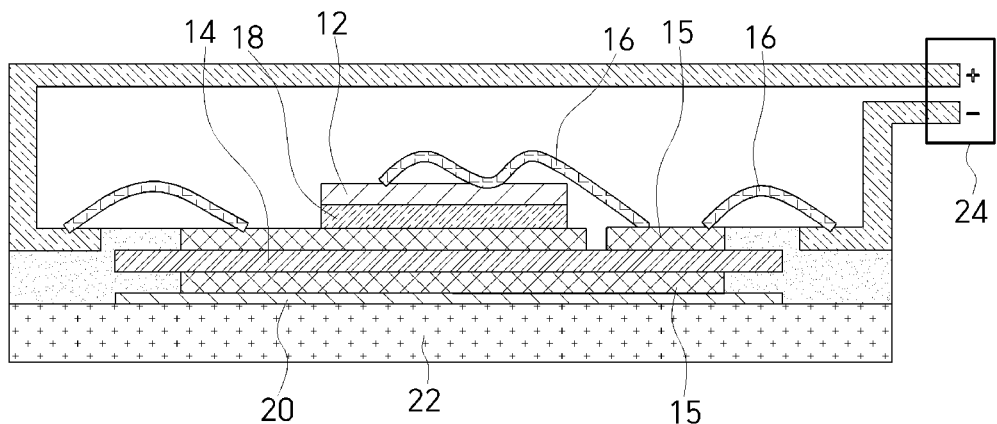
FIG. 1 is a cross-sectional view of a conceptual configuration of a power module.
Figure 2:
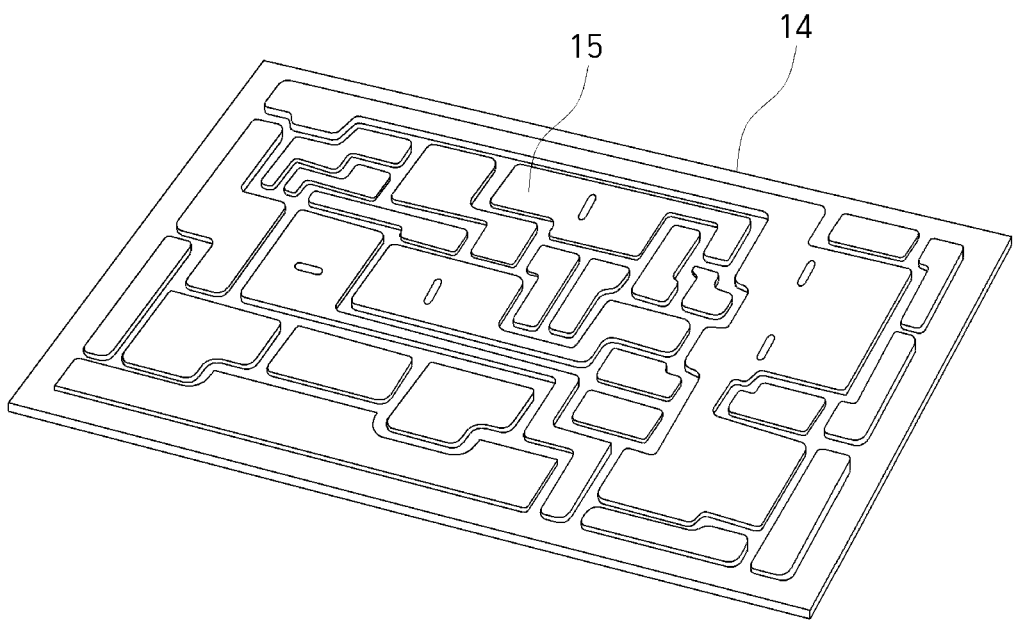
FIG. 2 is an exemplary view of a direct bond copper (DBC)
Figure 3:
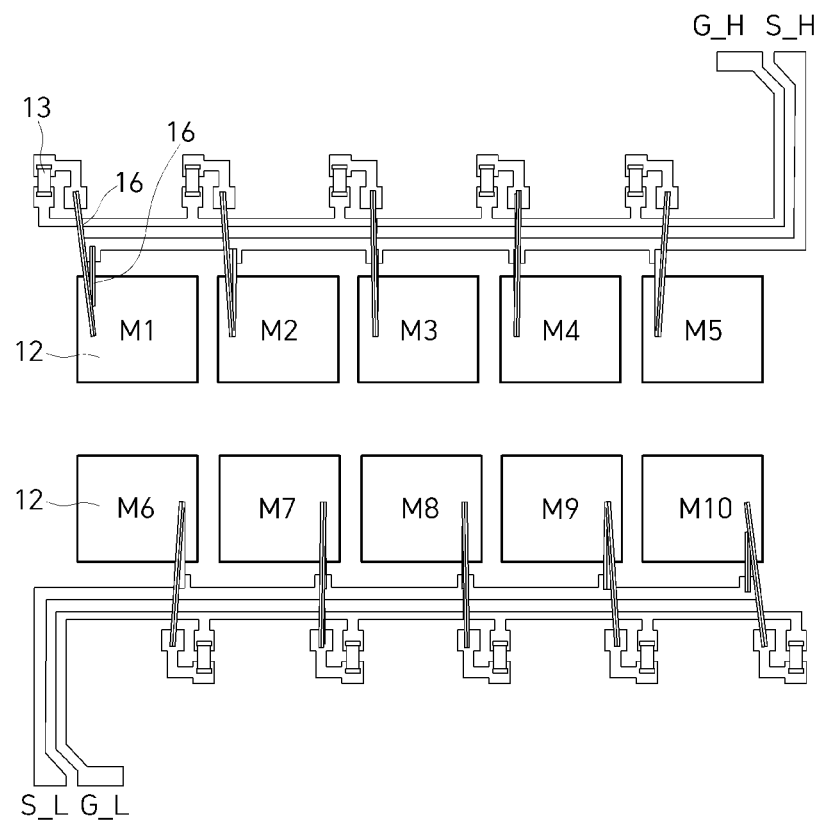
FIG. 3 is a configuration diagram of a conventional power module.
Figure 4:
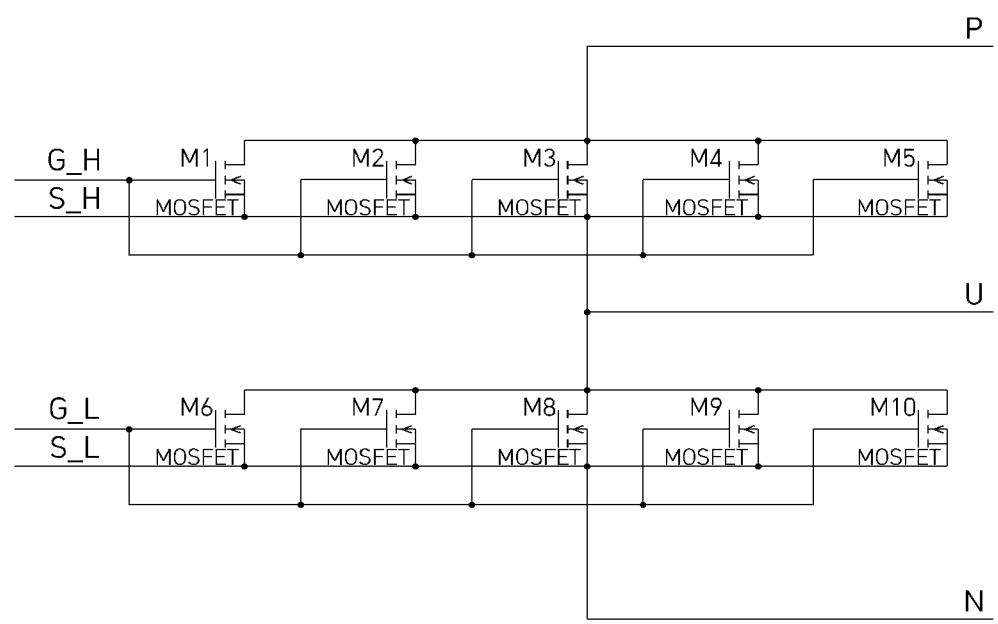
FIG. 4 is a circuit diagram of the power module in FIG. 3.

Cross-sectional areas of a gate line 26 and a source line 28 of a chip 12 through which current flows are increased compared to FIG. 3 illustrating a conventional power semiconductor power module. However, as shown in FIG. 2, increasing thicknesses of upper and lower sides of a direct bond copper (DBC) 14 is limited. Accordingly, Cu bonding is used to increase a current cross-sectional area by overcoming the limited DBC thickness and increasing widths of the gate line and the source line. Further, a gate resistor 13 for an upper chip M1 and a gate resistor 13' for a lower chip M10 are rotated by 90° unlike other resistors to form parasitic inductances similar to those of chips M2 and M9 respectively adjacent to the chips M1 and M10.

In a specific description, in FIG. 8, a DBC area at a left side becomes wider than a DBC area at a right side with respect to a portion "B" vertically indicated on an upper chip arrangement part. To this end, conductors 30 and 32 such as several strands of Cu or the like are bonded to the lines 26 and 28. As shown in FIG. 8, the gate line 26 is bonded to be wider than the source line 28, and to this end, five strands of conductor 30 are bonded to the gate line 26, and three strands of conductor 32 are bonded to the source line 28.

As another embodiment, in addition to Cu bonding, Al bonding and bonding using other various metals may be used. Further, a method of applying the same number of bonding strands to the gate line 26 and the source line 28 and performing soldering on the bonding to expand an area through which the current flows is also possible. Various types of solders may be used for a solder in this case.

As still another embodiment, the number of copper bonding strands may be increased to increase the area as the distance increases from a gate pin and a source pin. That is, in FIG. 8, more strands of bonding are applied to the gate line and the source line of M1 compared to the gate line and the source line of M4. Likewise, more strands of bonding are applied to the gate line and the source line of M10 compared to the gate line and the source line of M6.

Figure 5:
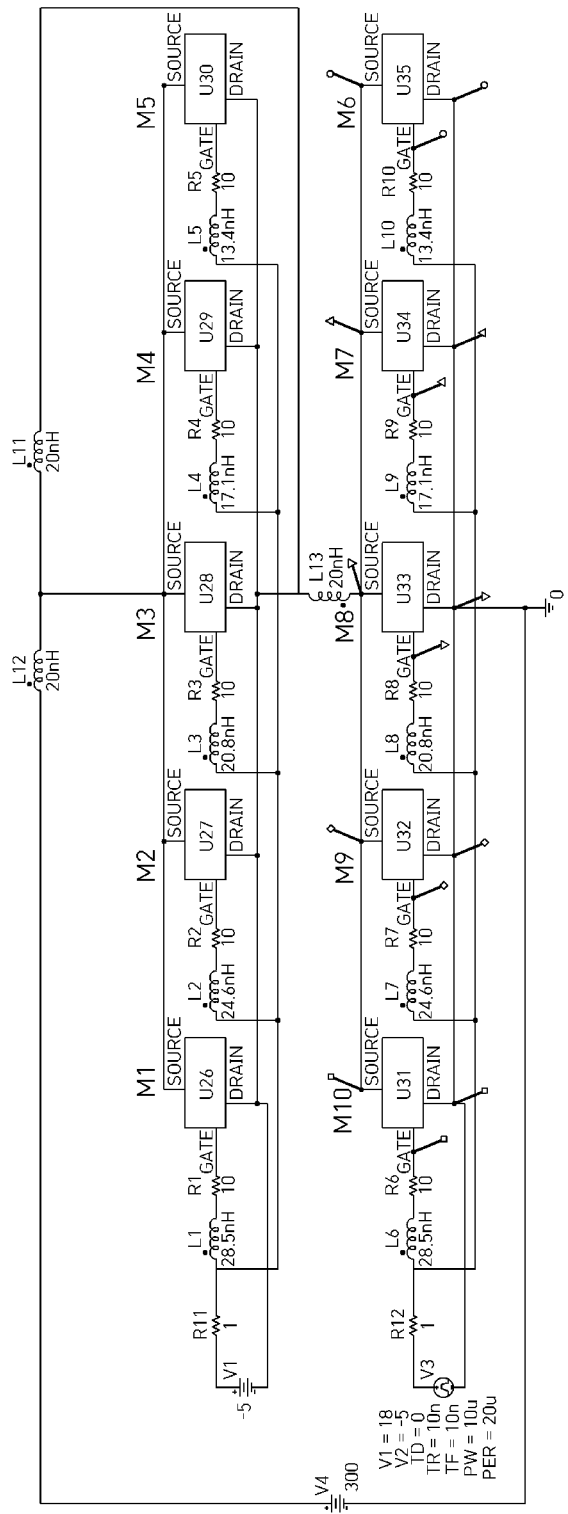
FIG. 5 illustrates a target circuit for performing simulation to check a current balance of the chips which are connected in parallel.
Figure 6:
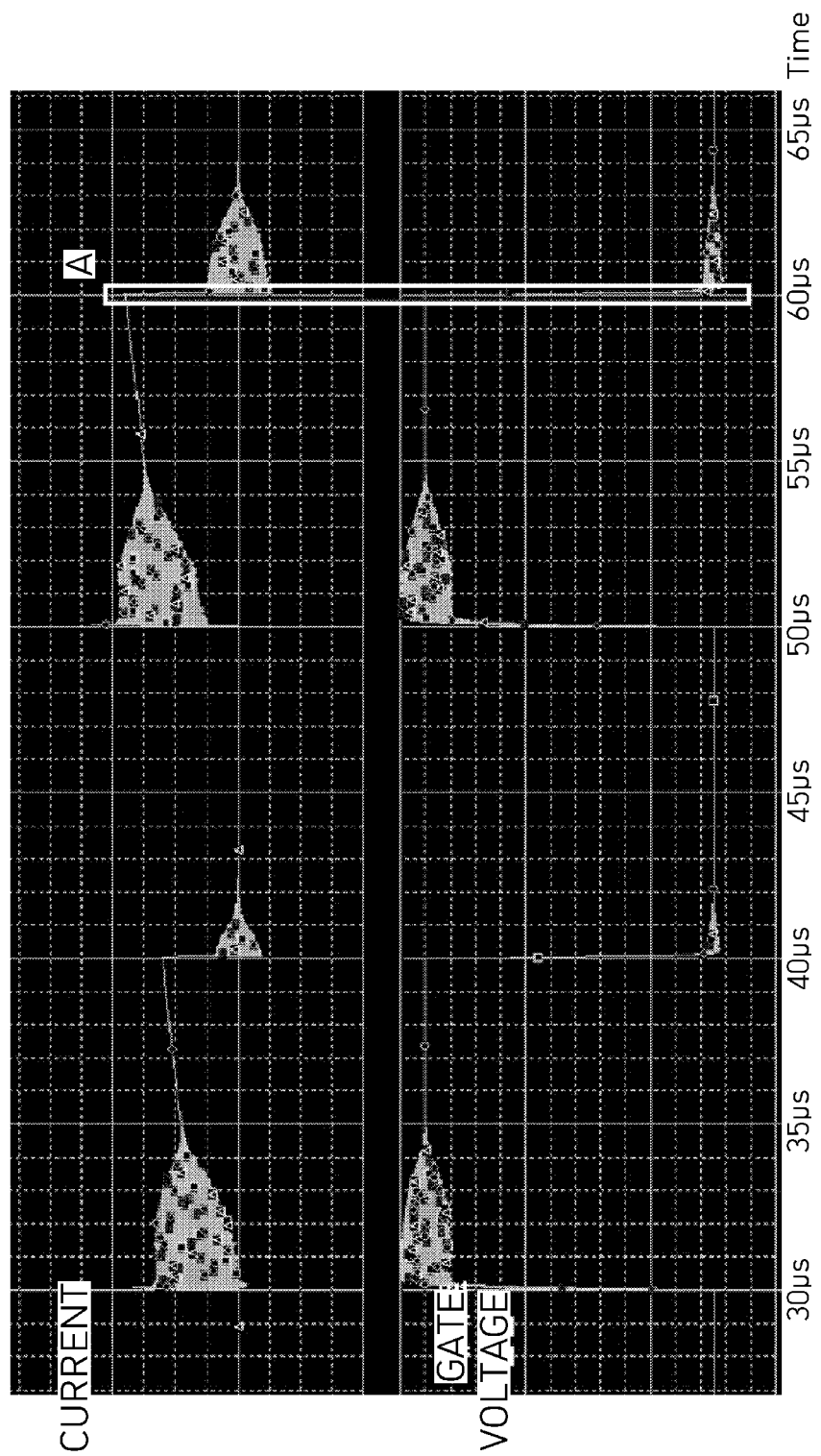
FIG. 6 illustrates a waveform of performing simulation of a circuit diagram in FIG. 5.

Like the above, in order to check a current balance of the power module composed of the chips which are connected in parallel according to the present invention, simulation is performed using a circuit the same as the circuit in FIG. 5. A parasitic inductance of the power module having the configuration in FIG. 8 is extracted through "Q3D" program by Ansys and added to each gate.

According to a result of the experiment, in a description with respect to the upper arrangement, M5 closest to the gate pin and the source pin was 15 nH and M1 most distant from the gate pin and the source pin was 24.1 nH. Compared to a conventional design in FIG. 3, the maximum and minimum difference between parasitic inductance values was reduced from 15.1 nH to 9.1 nH. Even in the lower arrangement having the same configuration, M6 closest to the gate pin and the source pin was 15 nH and M10 most distant from the gate pin and the source pin was 24.1 nH. The parasitic inductance values of the remaining chips are as follows: M2 is 21.9 nH, M3 is 19.2 nH, M4 is 16.5 nH, M7 is 16.5 nH, M8 is 19.2 nH, and M9 is 21.9 nH.

Figure 9:
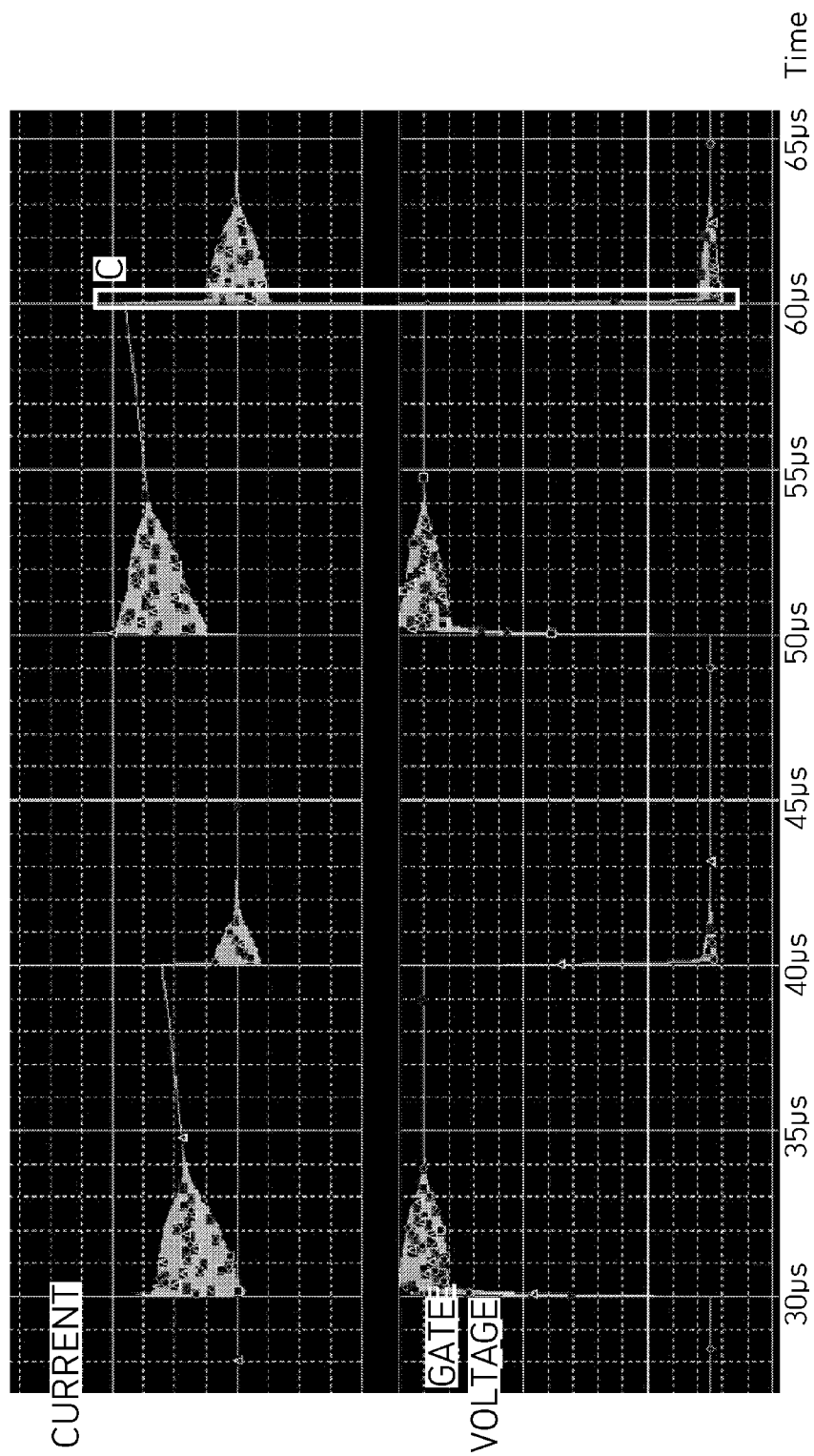
FIG. 9 is a waveform diagram of performing simulation of the power module to which the present invention is applied.

FIG. 9 is a waveform diagram of "OrCAD" simulation of the circuit diagram in FIG. 5, to which the present invention is applied. An upper waveform indicates a current flowing through each chip and a lower waveform indicates a gate voltage of each chip, which are obtained from the measurement points in the circuit diagram of FIG. 5.

Figure 7:
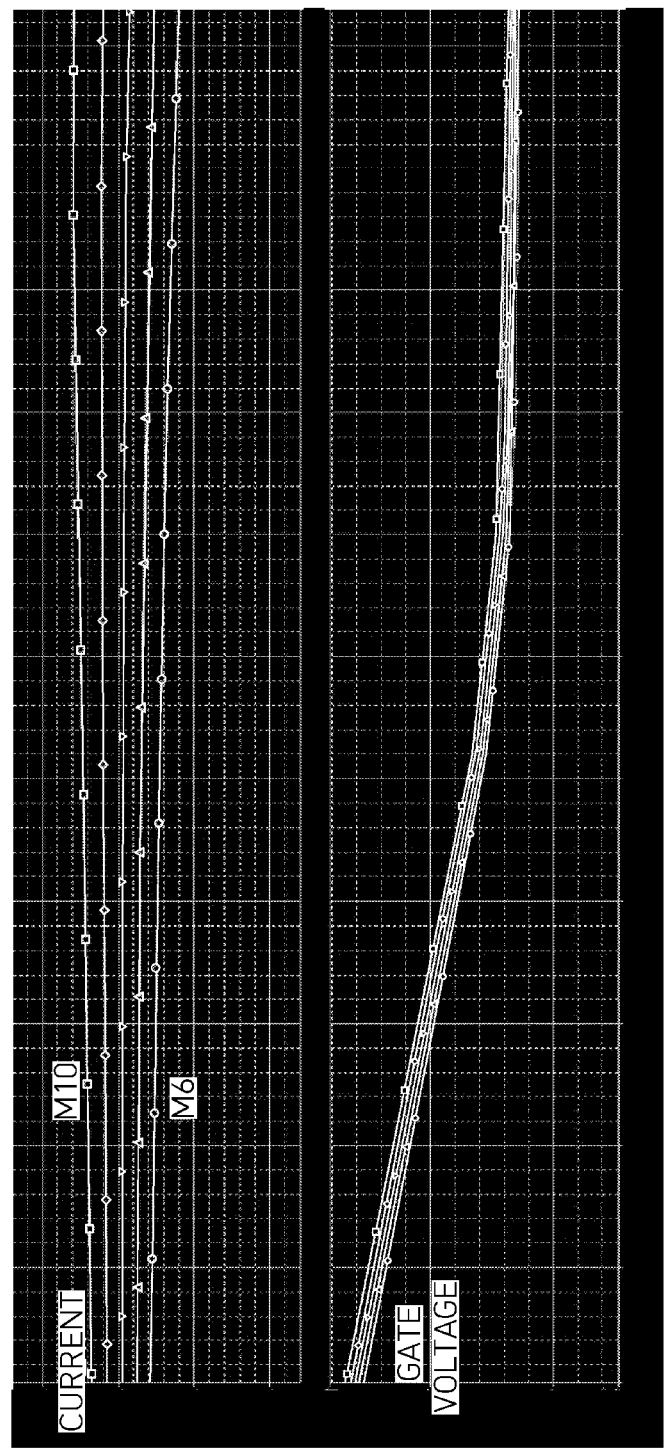
FIG. 7 illustrates an enlarged waveform of a portion "A" in FIG. 6.
Figure 10:
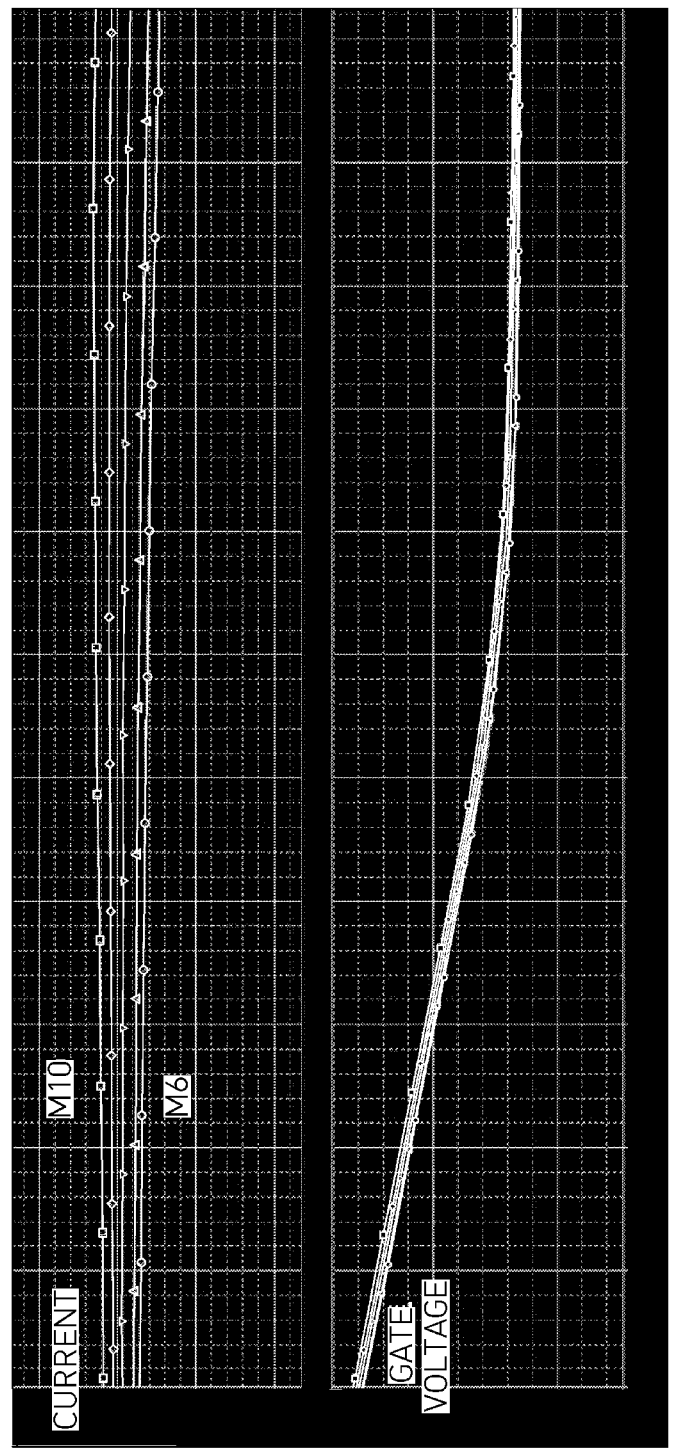
FIG. 10 illustrates an enlarged waveform of a portion "C" in FIG. 9.

FIG. 10 illustrates an enlarged waveform of a portion "C" indicated in FIG. 9. The indicated portion is a waveform when a switch of the chip is turned off. As shown in FIG. 7, square (□) marked lines indicate the most distant chip, and circle (○) marked lines indicate the closest chip. It can be seen that the most distant chip is more quickly turned off compared to other chips in the gate voltage waveform at a lower side in FIG. 10, and the current waveform at an upper side is also formed lower than those of other chips. A maximum current difference between M6 (17.75 A) and M10 (18.15 A) is 0.4 A, and a current deviation of 2% is present. Compared to FIG. 7 which is the simulation waveform of the previously designed power module, it can be seen that the current deviation of 2% is improved.

Although the present invention has been described in detail through preferable embodiments of the present invention, those skilled in the art may understand that the present invention may be embodied in specific forms other than contents disclosed in the specification without changing the technical spirit or essential features of the present invention.

The invention claimed is:

1. A method of improving a current balance of parallel chips in a power module including plural power semiconductor chips connected to gate lines and source lines extending from gate pins and source pins in parallel by different distances, the method comprising:

forming a current area of each of a gate line and a source line connected to power semiconductor chips other than a first power semiconductor chip closest to the gate pin and the source pin larger than a current area of each of a gate line and a source line connected to the first power semiconductor chip in the power module.

2. The method of claim 1, further comprising bonding conductors to the gate lines and the source lines connected to the power semiconductor chips other than the first power semiconductor chip to form the current area of each of the gate lines and the source lines connected to the power semiconductor chips other than the first power semiconductor chip larger than the current area of each of the gate line and the source line connected to the first power semiconductor chip.

3. The method of claim 2, further comprising performing soldering on the conductors bonded to the gate lines and the source lines.

4. The method of claim 1, comprising forming the current area of the gate line larger than the current area of the source line in each of the plural power semiconductor chips.

5. The method of claim 4, further comprising bonding conductors to the gate lines and the source lines to form the current area of the gate line larger than the current area of the source line in each of the plural power semiconductor chips, wherein the number of conductors bonded to the gate line is larger than the number of conductors bonded to the source line.

6. The method of claim 5, further comprising performing soldering on the conductors bonded to the gate lines and the source lines.

7. The method of claim 1, wherein the current area of each of the gate line and the source line connected to each of the power semiconductor chips increases in proportion to a distance between the first power semiconductor chip and the power semiconductor chips other than the first power semiconductor chip.

8. The method of claim 7, further comprising bonding conductors to the gate lines and the source lines so that the current area of each of the gate line and the source line connected to each of the power semiconductor chips increases in proportion to the distance between the first power semiconductor chip and the power semiconductor chips other than the first power semiconductor chip,
wherein the number of conductors bonded to the gate lines and the source lines increases in proportion to the distance between the first power semiconductor chip and the power semiconductor chips other than the first power semiconductor chip.

9. The method of claim 8, further comprising performing soldering on the conductors bonded to the gate lines and the source lines.

10. A power module comprising plural power semiconductor chips connected to gate lines and source lines extending from gate pins and source pins in parallel by different distances,
wherein a current area of each of the gate lines and the source lines connected to power semiconductor chips other than a first power semiconductor chip closest to the gate pin and the source pin is larger than a current area of each of the gate line and the source line connected to the first power semiconductor chip.

11. The power module of claim 10, further comprising conductors bonded to the gate lines and the source lines connected to the power semiconductor chips other than the first power semiconductor chip.

12. The power module of claim 11, further comprising a solder formed on each of the conductors bonded to the gate lines and the source lines.

13. The power module of claim 10, wherein the current area of the gate line is larger than the current area of the source line in each of the plural power semiconductor chips.

14. The power module of claim 13, further comprising conductors bonded to the gate lines and the source lines, wherein the number of conductors bonded to the gate line is larger than the number of conductors bonded to the source line.

15. The power module of claim 14, further comprising a solder formed on each of the conductors bonded to the gate lines and the source lines.

16. The power module of claim 10, wherein the current area of each of the gate line and the source line increases in proportion to a distance between the first power semiconductor chip and the power semiconductor chips other than the first power semiconductor chip.

17. The power module of claim 16, further comprising conductors bonded to the gate lines and the source lines, wherein the number of conductors bonded to the gate lines and the source lines increases in proportion to the distance between the first power semiconductor chip and the power semiconductor chips other than the first power semiconductor chip.

18. The power module of claim 17, further comprising a solder formed on each of the conductors bonded to the gate lines and the source lines.

* * * * *